United States Patent
Yu et al.

(10) Patent No.: US 8,339,883 B2
(45) Date of Patent: Dec. 25, 2012

(54) SEMICONDUCTOR MEMORY DEVICE

(75) Inventors: Je-min Yu, Seoul (KR); Byung-chul Kim, Suwon-si (KR); Jun-hyung Kim, Suwon-si (KR); Sang-joon Hwang, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 217 days.

(21) Appl. No.: 12/948,302

(22) Filed: Nov. 17, 2010

(65) Prior Publication Data
US 2011/0116334 A1    May 19, 2011

(30) Foreign Application Priority Data
Nov. 18, 2009  (KR) .......................... 10-2009-0111543

(51) Int. Cl.
*G11C 7/00*    (2006.01)

(52) U.S. Cl. ......... 365/203; 365/196; 365/205; 365/222

(58) Field of Classification Search .................. 365/203, 365/204, 205, 207, 222, 185.11, 185.13, 365/185.23
See application file for complete search history.

(56) References Cited

U.S. PATENT DOCUMENTS

| 7,525,858 | B2 | 4/2009 | Lee et al. |
| 7,855,926 | B2 * | 12/2010 | Shin et al. ...................... 365/190 |
| 7,929,367 | B2 * | 4/2011 | Yoo et al. ...................... 365/222 |
| 2006/0028888 | A1 | 2/2006 | Shin et al. |

FOREIGN PATENT DOCUMENTS

| KR | 10 2005-0043093 A | 5/2005 |
| KR | 10 2006-0012408 A | 2/2006 |
| KR | 10-0763247 B1 | 9/2007 |

* cited by examiner

*Primary Examiner* — Gene Auduong

(74) *Attorney, Agent, or Firm* — Lee & Morse, P.C.

(57) ABSTRACT

A semiconductor memory device includes a bitline sensing amp detecting and amplifying data of a pair of bitlines from a memory cell, a column selecting unit transmitting the data of the pair of bitlines to a pair of local datalines in response to a column selecting signal, a dataline precharging unit precharging the pair of local datalines to a precharging voltage level in response to a precharging signal, and a dataline sensing amp detecting and amplifying data transmitted to the pair of local datalines. The dataline sensing amp includes a charge sync unit discharging the pair of local datalines at the precharging voltage level in response to a first dataline sensing enabling signal and data of the pair of local datalines, and a data sensing unit transmitting data of the pair of local datalines to a pair of global datalines in response to a second dataline sensing enabling signal.

20 Claims, 8 Drawing Sheets

SEMICONDUCTOR MEMORY DEVICE

BACKGROUND

1. Field

Embodiments relates to a semiconductor memory device, and more particularly, to a semiconductor memory device with reduced bitline disturbance and a method of operating the same.

2. Description of the Related Art

Nowadays, it is desirable to for semiconductor memory devices to have larger capacity, lower power consumption, and faster operational speed. As the load capacitance on a dataline is increased, e.g., in order to increase the capacity of a semiconductor memory device, an operating voltage for a data accessing operation, such as a reading or writing operation, decreases, which leads to lower power consumption of the semiconductor memory device. However, as the operating voltage level is lowered, the sensing margin for detecting and amplifying memory cell data may be reduced.

SUMMARY

Embodiments are therefore directed to semiconductor memory device, which substantially overcome one or more of the problems due to the limitations and disadvantages of the related art.

It is therefore a feature of an embodiment to provide a semiconductor memory device with reduced bitline disturbance.

It is therefore another feature of an embodiment to provide a method of operating the semiconductor memory device.

At least one of the above and other features and advantages may be realized by providing a semiconductor memory device including a bitline sensing amp detecting and amplifying data of a pair of bitlines to which data of memory cell are transmitted; a column selecting unit transmitting the data of the pair of bitlines to a pair of local datalines in response to a column selecting signal; a dataline precharging unit precharging the pair of local datalines to a precharging voltage level in response to a precharging signal; and a dataline sensing amp detecting and amplifying data transmitted to the pair of local datalines, wherein the dataline sensing amp includes a charge sync unit discharging charges of the pair of local datalines at the precharging voltage level in response to a first dataline sensing enabling signal and data of the pair of local datalines; and a data sensing unit transmitting data of the pair of local datalines to a pair of global datalines in response to a second dataline sensing enabling signal.

The charge sync unit may detect and amplify the data of the pair of local datalines.

The first dataline sensing enabling signal may be simultaneously activated when the column selecting signal is activated. The first dataline sensing enabling signal may be activated before the second dataline sensing enabling signal is activated. The first dataline sensing enabling signal may be simultaneously activated with the second dataline sensing enabling signal. The first dataline sensing enabling signal may be activated after the second dataline sensing enabling signal.

The charge sync unit may include a first NMOS transistor, wherein a gate of the first NMOS transistor is connected to a local dataline and a drain of the first NMOS transistor is connected to a complementary local dataline; a second NMOS transistor, wherein a gate of the second NMOS transistor is connected to the complementary local dataline and a drain of the second NMOS transistor is connected to the local dataline; and a third NMOS transistor, wherein a drain of the third NMOS transistor is connected to sources of the first and second NMOS transistors, the first dataline sensing enabling signal is connected to a gate of the third NMOS transistor, and a source of the third NMOS transistor is grounded.

The data sensing unit may includes a first NMOS transistor, wherein the second dataline sensing enabling signal is transmitted to a gate of the first NMOS transistor, and the complementary global dataline is connected to a drain of the first NMOS transistor; a second NMOS transistor, wherein the second dataline sensing enabling signal is transmitted to a gate of the second NMOS transistor, and the global dataline is connected to a drain of the second NMOS transistor; a third NMOS transistor, wherein the local dataline is connected to a gate of the third NMOS transistor, and a source of the first NMOS transistor is connected to a drain of the third NMOS transistor; a fourth NMOS transistor, wherein the complementary local dataline is connected to a gate of the fourth NMOS transistor, and a source of the second NMOS transistor is connected to a drain of the fourth NMOS transistor; and a fifth NMOS transistor, wherein the sources of the third and fourth NMOS transistors are connected to a drain of the fifth NMOS transistor, the second dataline enabling sensing enabling signal is transmitted to a gate of the fifth NMOS transistor, and a ground voltage VSS is input to a source of the fifth NMOS transistor.

At least one of the above and other features and advantages may also be realized by providing a semiconductor memory device including a bitline sensing amp detecting and amplifying data of a pair of bitlines to which data of memory cell are transmitted; a column selecting unit transmitting the data of the pair of bitlines to a pair of local datalines in response to a column selecting signal; a dataline precharging unit precharging the pair of local datalines to a precharging voltage level in response to a precharging signal; and a dataline sensing amp detecting and amplifying the data transmitted to the pair of local datalines, wherein the dataline sensing amp includes a sensing control unit generating an inversed dataline sensing enabling signal in response to a dataline sensing enabling signal; a charge sync unit discharging charges of the pair of local datalines at the precharging voltage level in response to the dataline sensing enabling signal, the inversed dataline sensing enabling signal, and the data of the pair of local datalines; and a data sensing unit transmitting the data of the pair of local datalines to a pair of global datalines in response to a second dataline sensing enabling signal.

The first dataline sensing enabling signal may be simultaneously activated when the column selecting signal is activated.

According to another aspect of the inventive concept, there is provided a method of operating a semiconductor memory device, the method including precharging a pair of local datalines to a precharging voltage level in response to a precharging signal; detecting and amplifying a pair of bitlines to which data of memory cell are transmitted; transmitting data of the pair of bitlines to the pair of local datalines in response to a column selecting signal; discharging charges of the pair of local datalines at the precharging voltage level in response to a first dataline sensing enabling signal and data of the pair of local datalines and detecting and amplifying data of the pair of local datalines; and transmitting data of the pair of local datalines to a pair of global datalines in response to a second dataline sensing enabling signal.

According to another aspect of the inventive concept, there is provided a method of operating a semiconductor memory device, the method including precharging a pair of local datalines to a precharging voltage level in response to a precharging signal; detecting and amplifying a pair of bitlines to which data of memory cell are transmitted; transmitting data of the pair of bitlines to the pair of local datalines in response to a column selecting signal; discharging charges of the pair of local datalines at the precharging voltage level in response to a dataline sensing enabling signal, an inversed dataline sensing enabling signal, and data of the pair of local datalines and detecting and amplifying data of the pair of local datalines; and transmitting data of the pair of local datalines to a pair of global datalines in response to the dataline sensing enabling signal.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
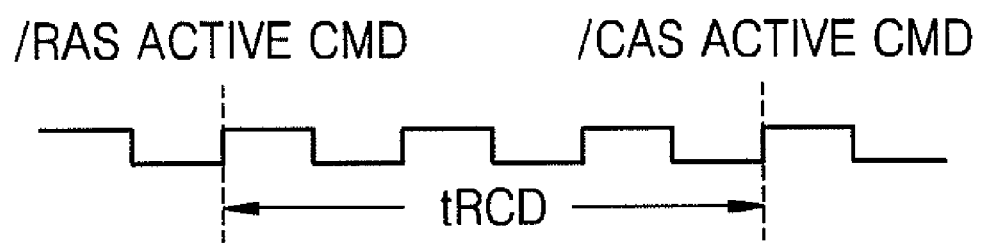
FIG. 1 illustrates a diagram for describing tRCD timing parameters.

Korean Patent Application No. 10-2009-0111543, filed on Nov. 18, 2009, in the Korean Intellectual Property Office, and entitled: "Semiconductor Memory Device," is incorporated by reference herein in its entirety.

Example embodiments will now be described more fully hereinafter with reference to the accompanying drawings; however, they may be embodied in different foams and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

A dynamic random access memory (DRAM) detects and amplifies data read from a memory cell via a bitline sensing amp. The bitline sensing amp increases and develops the voltage difference between a pair of bitlines that are charge-shared by using the memory cell data transmitted to the pair of bitlines. The data detected and amplified by the bitline sensing amp is detected and amplified again by a dataline sensing amp and is read out to outside.

As shown in FIG. 1, a /RAS to /CAS delay time (tRCD), which is one of the important parameters for operating a DRAM at high speed, is the time interval between a /RAS active command and a /CAS active command. A DRAM may be operated at higher speed as the tRCD becomes shorter. The /RAS active command activates a wordline connected to which a memory cell to be read out is connected. When the wordline is activated, data of all memory cells connected to the wordline are transmitted to corresponding bitlines. A bitline sensing amp develops the voltage difference between a pair of bitlines that are charge-shared by using the memory cell of which data is to be read data transmitted to the pair of bitlines. The /CAS active command activates a column selecting signal and transmits data of the pair of bitlines of the memory cell of which data is to be read to a pair of datalines.

Figure 2:
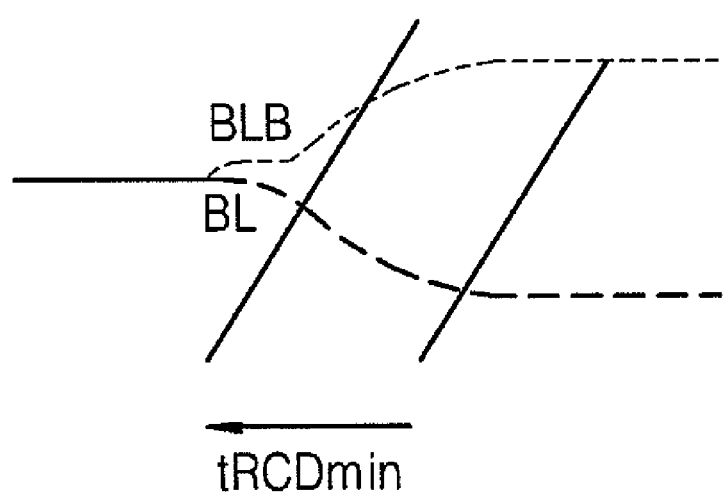
FIG. 2 illustrates a diagram for describing the relationship between amplification of data of a pair of bitlines and tRCD.

FIG. 2 is a diagram for describing the relationship between amplification of data of a pair of bitlines and tRCD. Referring to FIG. 2, in the waveform charged-shared, amplified, and developed by memory cell data transmitted to the pair of bitlines BL and BLB, data of the pair of bitlines BL and BLB are transmitted to the pair of datalines after the pair of bitlines BL and BLB are sufficiently developed. As explained above, a DRAM may be operated at a higher speed as the tRCD decreases. As the tRCD is minimized, data of the pair of bitlines BL and BLB may be transmitted to the pair of datalines before the data are fully amplified. Therefore, the voltage difference between the pair of datalines may be reduced to a value smaller than a value detectable by a dataline sensing amp. In this case, the dataline sensing amp may function abnormally.

Furthermore, if data of the pair of bitlines BL and BLB are transmitted to the pair of datalines before the data are fully amplified, charges of the pair of datalines, which are precharged to a precharge level, may flow to the pair of bitlines BL and BLB, and thus may disturb operations of the bitline sensing amp. Such a bitline disturbance causes, e.g., mismatching of the bitline sensing amp, and thus the bitline sensing amp may function abnormally.

Figure 3:
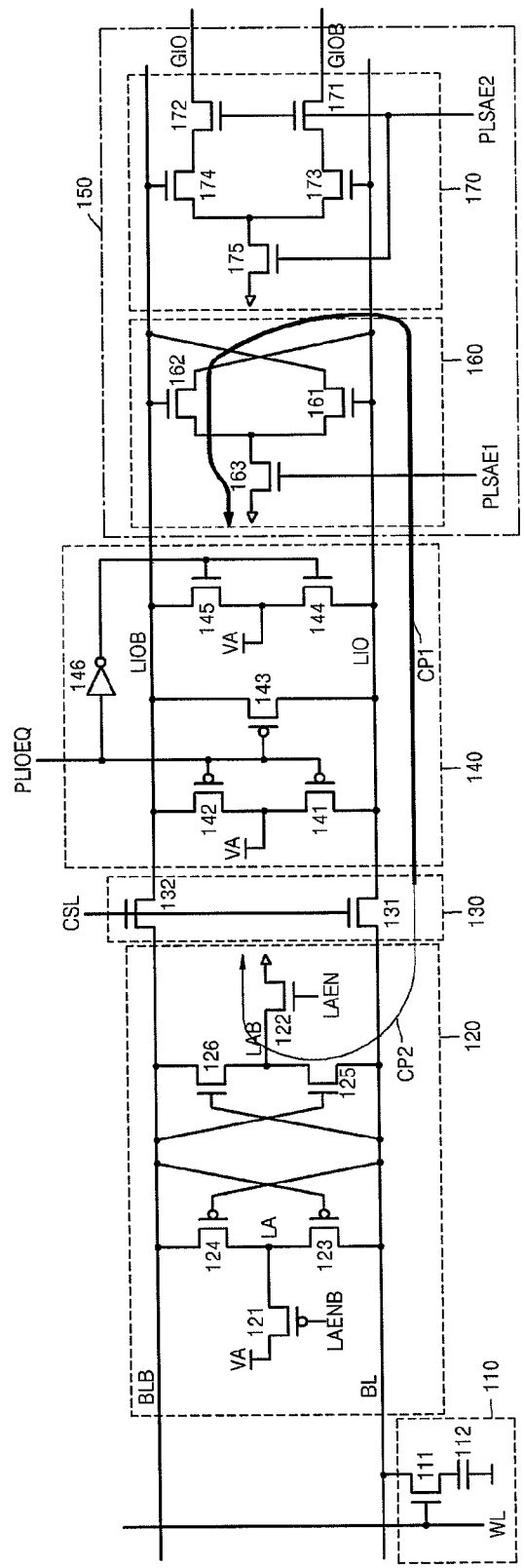
FIG. 3 illustrates a diagram for describing a semiconductor memory device according to an exemplary embodiment.

FIG. 3 is a diagram for describing a semiconductor memory device 100 according to an exemplary embodiment. Referring to FIG. 3, the semiconductor memory device 100 includes a memory cell 110, a bitline sensing amp 120, a column selecting unit 130, a dataline precharging unit 140, and a dataline sensing amp 150.

The memory cell 110 is located at the intersection of the pair of bitlines BL and BLB and a wordline WL, and includes a cell transistor 111 and a cell capacitor 112. The cell transistor 111 transmits data stored in the cell capacitor 112 to the bitline BL when the wordline WL is activated. For convenience of explanation, it is assumed that one memory cell 110 is connected to one pair of bitlines BL and BLB and one wordline WL. A matrix-type memory cell array is formed as the memory cells 110 are respectively connected at the intersections of a plurality of pairs of bitlines BLs and BLBs and a plurality of wordlines WLs.

The bitline sensing amp 120 develops the voltage levels of the pair of bitlines BL and BLB by detecting and amplifying memory cell data transmitted to the pair of bitlines BL and BLB. The bitlines sensing amp 120 includes a first PMOS transistor 121, which supplies a power voltage VA to a first node LA in response to a first bitline sensing enabling signal LAENB, and a first NMOS transistor 122, which supplies a ground voltage VSS to a second node LAB in response to a second bitline sensing enabling signal LAEN. Furthermore, the bitline sensing amp 120 includes second and third PMOS transistors 123 and 124 and second and third NMOS transistors 125 and 126, which are cross-connected between the pair of bitlines BL and BLB. The second and third PMOS transistors 123 and 124 are respectively interconnected between the first node LA and the bitline BL and between the first node LA and the complementary bitline BLB, wherein a gate of the second PMOS transistor 123 is connected to the complementary bitline BLB and a gate of the third PMOS transistor 124 is connected to the bitline BL. The second and third NMOS transistors 125 and 126 are respectively interconnected between the second node LAB and the bitline BL and between the second node LAB and the complementary bitline BLB, wherein a gate of the second NMOS transistor 125 is connected to the complementary bitline BLB, and a gate of the third NMOS transistor 126 is connected to the bitline BL.

The column selecting unit 130 transmits data of the pair of bitlines BL and BLB to a pair of local datalines LIO and LIOB in response to a column selecting signal CSL. The column selecting unit 130 includes a first NMOS transistor 131, which connects the bitline BL to the local dataline LIO in response to the column selecting signal CSL, and a second NMOS transistor 132, which connects the complementary bitline BLB to the complementary local dataline LIOB in response to the column selecting signal CSL. The column selecting signal CSL is generated by a column decoder (not shown), which decodes a column address input to the semiconductor memory device 100, and connects the pair of bitlines BL and BLB of the memory cell 110, which stores data to be read out, to the pair of local datalines LIO and LIOB.

The dataline precharging unit 140 precharges the pair of local datalines LIO and LIOB in response to a precharging signal PLIOEQ. The dataline precharging unit 140 includes a first PMOS transistor 141, which is interconnected between the power voltage VA and the local dataline LIO, a second PMOS transistor 142, which is interconnected between the power voltage VA and the complementary local dataline LIOB, and a third PMOS transistor 143, which is interconnected between the local dataline LIO and the complementary local dataline LIOB. The first through third PMOS transistors 141, 142, and 143 are controlled by a precharging signal PLIOEQ. The dataline precharging unit 140 includes a first NMOS transistor 144, which is interconnected between the power voltage VA and the local dataline LIO, and a second NMOS transistor 145, which is interconnected between the power voltage VA and the complementary local dataline LIOB. The first and second NMOS transistors 144 and 145 are controlled by outputs of an inverter 146. The inverter 146 inputs precharging signals to the first and second NMOS transistors 144 and 145. The first through third PMOS transistors 141, 142, and 143 and the first and second NMOS transistors 144 and 145 are turned on in response to a precharging signal PLIOEQ at a logic low level and precharge the pair of local datalines LIO and LIOB to the level of the power voltage VA.

The dataline sensing amp 150 includes a charge sync unit 160 and a data sensing unit 170. The charge sync unit 160 discharges charges of the pair of local datalines LIO and LIOB, which are precharged to the power voltage VA level, in response to a first dataline sensing enabling signal PLSAE1 and detects and amplifies data of the pair of the local datalines LIO and LIOB. The data sensing unit 170 detects and amplifies data of the pair of the local datalines LIO and LIOB in response to a second dataline sensing enabling signal PLSAE2 and transmits the amplified data to a pair of global datalines GIO and GIOB.

The charge sync unit 160 includes a first NMOS transistor 161, a second NMOS transistor 162, and a third NMOS transistor 163, wherein a gate of the first NMOS transistor 161 is connected to the local dataline LIO, a drain of the first NMOS transistor 161 is connected to the complementary local dataline LIOB, a gate of the second NMOS transistor 162 is connected to the complementary local dataline LIOB, a drain of the second NMOS transistor 162 is connected to the local dataline LIO, a drain of the third NMOS transistor 163 is connected to sources of the first and second NMOS transistors 161 and 162, the first dataline sensing enabling signal PLSAE1 is connected to a gate of the third NMOS transistor 163, and the ground voltage line is connected to the source of the third NMOS transistor 163.

The data sensing unit 170 includes a first NMOS transistor 171, a second NMOS transistor 172, a third NMOS transistor 173, a fourth NMOS transistor 174, and a fifth NMOS transistor 175, wherein the second dataline sensing enabling signal PLSAE2 is connected to a gate of the first NMOS transistor 171, the complementary global dataline GIOB is connected to a drain of the first NMOS transistor 171, the second dataline sensing enabling signal PLSAE2 is connected to a gate of the second NMOS transistor 172, the global dataline GIO is connected to a drain of the second NMOS transistor 172, the local dataline LIO is connected to the gate of the third NMOS transistor 173, the source of the first NMOS transistor 171 is connected to a gate of the third NMOS transistor 173, the complementary local dataline LIOB is connected to a gate of the fourth NMOS transistor 174, the source of the second NMOS transistor 172 is connected to a drain of the fourth NMOS transistor 174, the sources of the third and fourth NMOS transistors 173 and 174 are connected to a drain of the fifth NMOS transistor 175, the second dataline enabling sensing enabling signal PLSAE2 is connected to a gate of the fifth NMOS transistor 175, and the ground voltage line VSS is connected to the source of the fifth NMOS transistor 175.

Figure 4:
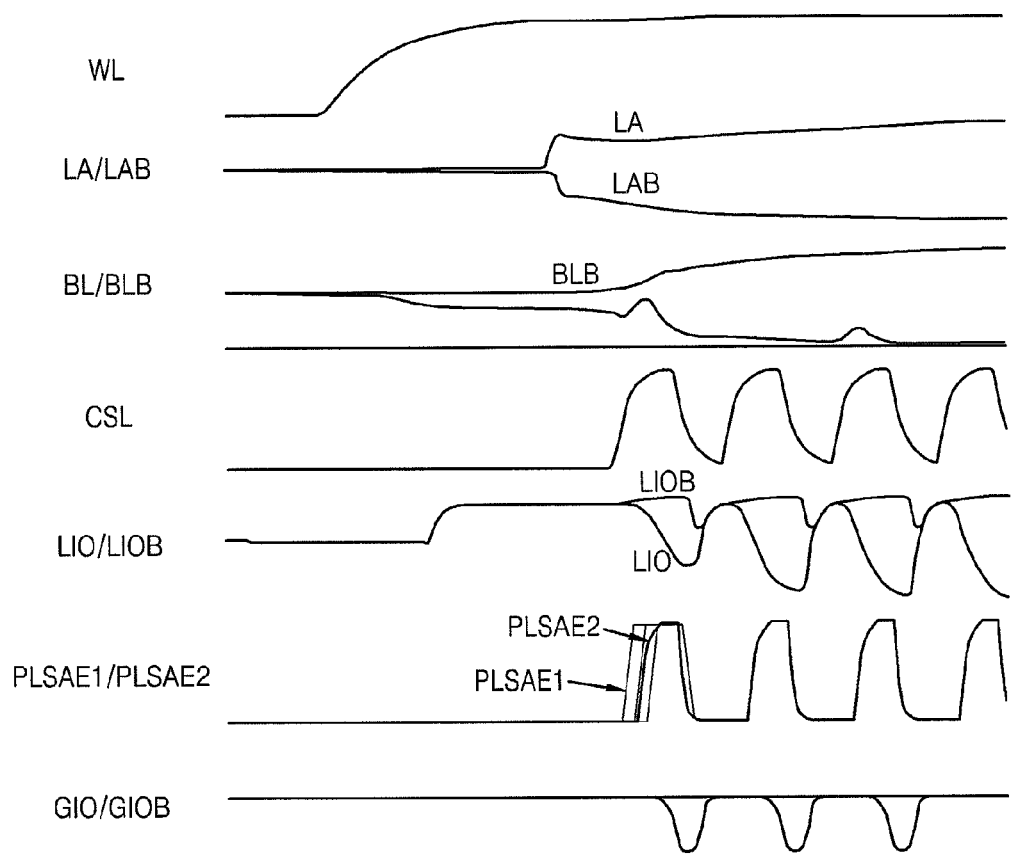
FIG. 4 illustrates a timing diagram for describing operations of the semiconductor memory device shown in FIG. 3.

FIG. 4 is a timing diagram for describing operations of the semiconductor memory device 100 shown in FIG. 3. Referring to FIGS. 3 and 4, the wordline WL of the memory cell 110 storing data to be read out is enabled, data in the memory cell 110 is transmitted to the pair of bitlines BL and BLB, and the pair of bitlines BL and BLB are charged by the data of the memory cell 110. When the bitline sensing amp 120 is enabled by the logic high level of the first bitline sensing enabling signal LAEN and the logic low level of the second bitline sensing enabling signal LAENB, the first node LA has a power voltage VA level, the second node LAB has a ground voltage VSS level, and data of the pair of bitlines BL and BLB are detected and amplified. Therefore, the voltage levels of the pair of bitlines BL and BLB are developed. The pair of local datalines LIO and LIOB are precharged to the power voltage VA level in response to activation of the precharging signal PLIOEQ.

Next, when the precharging signal PLIOEQ is deactivated and the column selecting signal CSL is activated to a logic high level, data of the pair of bitlines BL and LBL are transmitted to the pair of local datalines LIO and LIOB. As the pair of local datalines LIO and LIOB, which are precharged to the power voltage VA level, are connected to the pair of bitlines BL and BLB, the voltage levels of the pair of bitlines BL and BLB momentarily rise. In other words, the voltage levels of the pair of bitlines BL and BLB rise as charges of the pair of local datalines LIO and LIOB flow into the pair of bitlines BL and BLB. This phenomenon is referred to as bitline disturbance. If the bitline disturbance occurs before data of the pair of bitlines BL and BLB are sufficiently developed by the bitline sensing amp 120, data of the pair of bitlines BL and BLB may be reversed in the worst case. In this case, the bitline sensing amp 120 functions abnormally.

To improve bitline disturbance, the first dataline sensing enabling signal PLSAE1 of the dataline sensing amp 150 is activated at the time of activation of the column selecting signal CSL. When the first dataline sensing enabling signal PLSAE1 is activated to a logic high level, the third NMOS transistor 163 of the charge sync unit 160 is turned on. For example, it is assumed that the voltage level of data of the bitline BL is logic low and the voltage level of data of the complementary bitline BLB is logic high, and the data of the pair of bitlines BL and BLB are detected and amplified by the bitline sensing amp 120. The column selecting signal CSL is activated, the logic low voltage of the bitline BL is transmitted to the local dataline LIO, and the logic high voltage of the complementary bitline BLB is transmitted to the complementary local dataline LIOB. At the same time, when the first dataline sensing enabling signal PLSAE1 is activated, the second NMOS transistor 162, which is controlled by the complementary local dataline LIOB having the logic high voltage level, is turned on, and thus charges of the local dataline LIO are discharged via a first path CP1 consisting of the second NMOS transistor 162 and the third NMOS transistor 163.

The charges of the local dataline LIO are discharged not only via the first path CP1 in the dataline sensing amp 150, but also via a second path CP2 in the bitline sensing amp 120. The second path CP2 consists of the second NMOS transistor 125, which is turned on by the complementary bitline BLB having the logic high voltage level, and the first NMOS transistor 122, which is turned on by the second bitline sensing enabling signal LAEN, of the bitlines sensing amp 120. Since the sizes of the transistors 121 through 126 of the bitlines sensing amp 120 are smaller than the sizes of the transistors 161 through 163 of the charge sync unit 160 in the dataline sensing amp 160, most of the charges of the local dataline LIO are discharged via the first path CP1 rather than the second path CP2. As a result, the amount of charges flowing into the bitline sensing amp 120 is significantly reduced, and thus the bitlines disturbance may be reduced.

Meanwhile, the charge sync unit 160 changes the logic low voltage level of the local dataline LIO to the logic low ground voltage VSS level via the first path CP1. Also, the voltage level of the complementary local dataline LIOB becomes logic high as the logic high voltage of the complementary bitline BLB transmitted via the column selecting unit 130 becomes equal to the power voltage VA by the operation of the dataline precharging unit 140. In other words, the charge sync unit 160 detects and amplifies data of the pair of local datalines LIO and LIOB.

In the same regard, if data the bitline BL which is detected and amplified by the bitline sensing amp 120 has a logic high voltage level and data of the complementary bitline BLB has a logic low voltage level, charges of the complementary bitline BLB precharged to the power voltage VA level are mainly discharged via a first path consisting of the first NMOS transistor 161 and the third NMOS transistor 163 within the charge sync unit 160, and thus the bitline disturbance may be reduced by reducing charges flowing into the bitline sensing amp 120. The charge sync unit 160 detects and amplifies the complementary local dataline LIOB to a logic low ground voltage VSS level, and detects and amplifies the local dataline LIO to a logic high power voltage VA level.

When the second dataline sensing enabling signal PLSAE2 is activated after the activation of the first dataline sensing enabling signal PLSAE1, the first, second, and fifth NMOS transistors 171, 172, and 175 of the data sensing unit 170 in the dataline sensing amp 150 are turned on. When the voltage of the local dataline LIO is a logic low level and the voltage of the complementary local dataline LIOB is a logic high level by the charge sync unit 160, for example, the fourth NMOS transistor 174 of the data sensing unit 170 is turned on, and thus the voltage of the global dataline GIO becomes logic low. The complementary global dataline GIOB maintains the logic high power voltage VA level precharged by a global dataline precharging unit (not shown). Accordingly, the dataline sensing amp 150 detects and amplifies data of the pair of local datalines LIO and LIOB and transmits the amplified data to the pair of global datalines GIO and GIOB.

Meanwhile, the data sensing unit 170 splits the pair of local datalines LIO and LIOB from the pair of global datalines GIO and GIOB and transmits data of the pair of local datalines LIO and LIOB to the pair of global datalines GIO and GIOB. In other words, the pair of bitlines BL and BLB are connected to the pair of local datalines LIO and LIOB via the transistors 131 and 132 of the column selecting unit 130, and thus the voltage level of the pair of local datalines LIO and LIOB direct affects the pair of bitlines BL and BLB, like the bitline disturbance described above. The pair of local datalines LIO and LIOB are connected to gates of the third and fourth NMOS transistors 173 and 174 of the data sensing unit 170, and the pair of global datalines GIO and GIOB are connected to drains of the first and second NMOS transistors 171 and 172 of the data sensing unit 170, and thus the pair of local datalines LIO and LIOB and the pair of global datalines GIO and GIOB are not directly connected to each other. Since data of the pair of local datalines LIO and LIOB do not directly affect the pair of global datalines GIO and GIOB, voltages of the pair of global datalines GIO and GIOB are not immediately affected even if the voltage level of the pair of local datalines LIO and LIOB fluctuates due to changes of voltages or noises during operations of the semiconductor memory device 100.

The present embodiment relates to a case where the first dataline sensing enabling signal PLSAE1 is activated before the second dataline sensing enabling signal PLSAE2 is activated. Alternatively, if the first dataline sensing enabling signal PLSAE1 and the second dataline sensing enabling signal PLSAE2 are simultaneously activated, the operation of discharging charges of the local dataline LIO by the charge sync unit 160 and the operation of detecting and amplifying data of the pair of local datalines LIO and LIOB are simultaneously performed. Alternatively, if the second dataline sensing enabling signal PLSAE2 is activated before the first dataline sensing enabling signal PLSAE1 is activated, the operation of discharging charges of the local dataline LIO by the charge sync unit 160 and the operation of detecting and amplifying data of the pair of local datalines LIO and LIOB are simultaneously performed while data of the pair of bitlines BL and BLB transmitted to the pair of local datalines LIO and LIOB are being transmitted to the pair of global datalines GIO and GIOB via the data sensing unit 170. The two cases described above are for preventing abnormal operations of the bitline sensing amp 120 because the bitline sensing amp 120 operates even during the sensing operation of the dataline sensing amp 150.

Figure 5:
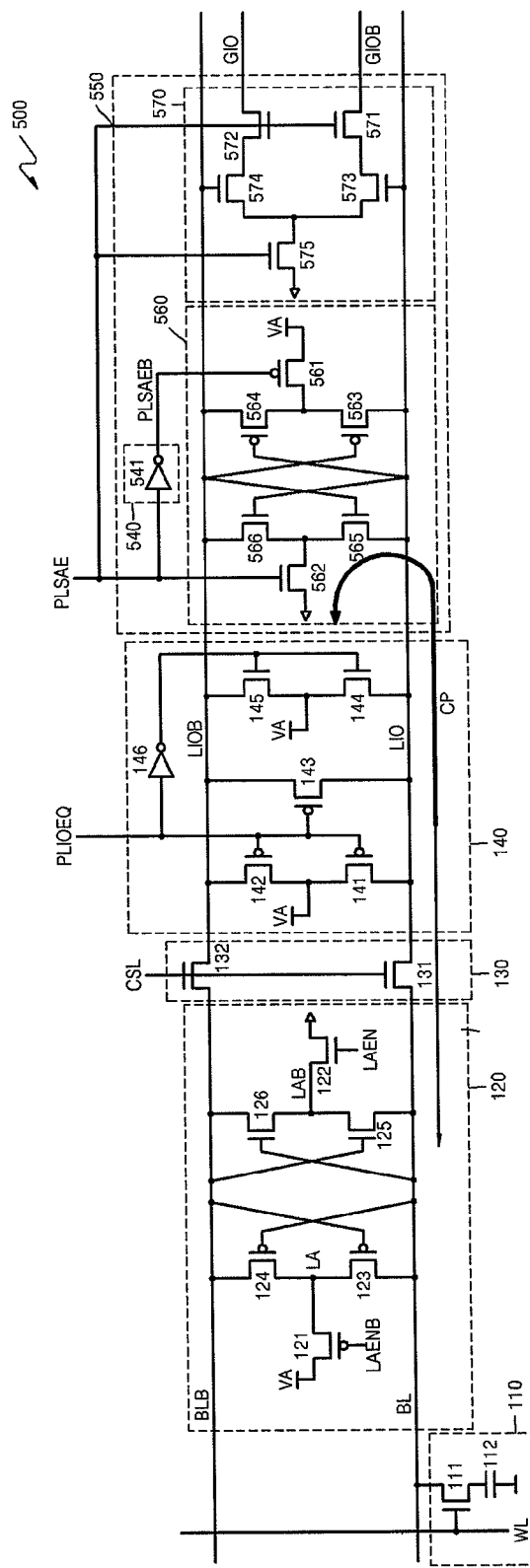
FIG. 5 illustrates a diagram for describing a semiconductor memory device according to an exemplary embodiment.

FIG. 5 is a diagram for describing a semiconductor memory device 500 according to an exemplary embodiment. Referring to FIG. 5, the semiconductor memory device 500 is identical to the semiconductor memory device 100 shown in FIG. 3 except for a dataline sensing amp 550. Detailed descriptions of the memory cell 110, the bitline sensing amp 120, the column selecting unit 130, and the dataline precharging unit 140 will be omitted below.

The dataline sensing amp 550 includes a sensing control unit 540, a charge sync unit 560, and a data sensing unit 570. The sensing control unit 540 generates an inversed dataline sensing enabling signal PLSAEB in response to a dataline sensing enabling signal PLSAE. The charge sync unit 560 discharges charges of the pair of local datalines LIO and LIOB, which are precharged to the power voltage VA level, and detects and amplifies data of the pair of local datalines LIO and LIOB in response to the dataline sensing enabling signal PLSAE and the inversed dataline sensing enabling signal PLSAEB. The data sensing unit 570 transmits the amplified data of the local datalines LIO and LIOB to the pair of global datalines GIO and GIOB in response to the dataline sensing enabling signal PLSAE.

The sensing control unit 540 comprises an inverter 541, which inputs the dataline sensing enabling signal PLSAE and outputs the inversed dataline sensing enabling signal PLSAEB. The charge sync unit 560 includes a first PMOS transistor 561 and a first NMOS transistor 562, wherein the inversed dataline sensing enabling signal PLSAEB is connected to a gate of the first PMOS transistor 561, the power voltage VA is input to a source of the first PMOS transistor 561, the dataline sensing enabling signal PLSAE is connected to a gate of the first NMOS transistor 562, and the ground voltage VSS is input to the source of the first NMOS transistor 562. Furthermore, the charge sync unit 560 includes second and third PMOS transistors 563 and 564 and second and third NMOS transistors 565 and 566, which are cross-connected between the pair of local datalines LIO and LIOB. The second and third PMOS transistors 563 and 564 are respectively interconnected between a drain of the first PMOS transistor 561 and the local dataline LIO and between the drain of the first PMOS transistor 561 and the complementary local dataline LIOB, a gate of the second PMOS transistor 563 is connected to the complementary local dataline LIOB, and a gate of the third PMOS transistor 564 is connected to the local dataline LIO. The second and third NMOS transistors 565 and 566 are respectively interconnected between the drain of the first NMOS transistor 562 and the local dataline LIO and between the drain of the first NMOS transistor 562 and the complementary local dataline LIOB, a gate of the second NMOS transistor 565 is connected to the complementary local dataline LIOB, and a gate of the third NMOS transistor 566 is connected to the local dataline LIO.

In the charge sync unit 560, when the dataline sensing enabling signal PLSAE is activated to logic high and the inversed the dataline sensing enabling signal PLSAEB is activated to logic low, the first PMOS transistor 561 and the first NMOS transistor 562 are turned on. For example, it is assumed below that the voltage level of data of the bitline BL is logic low and the voltage level of data of the complementary bitline BLB is logic high, and the data of the pair of bitlines BL and BLB are detected and amplified by the bitline sensing amp 120. The column selecting signal CSL is activated, the logic low voltage of the bitline BL is transmitted to the local dataline LIO, and the logic high voltage of the complementary bitline BLB is transmitted to the complementary local dataline LIOB. The second NMOS transistor 565, which is controlled by the complementary local dataline LIOB having the local high voltage level, is turned on, and thus charges of the local dataline LIO are discharged via a current path CP consisting of the first NMOS transistor 562 and the second NMOS transistor 565.

The charge sync unit 560 changes the logic low voltage level of the local dataline LIO to the logic low ground voltage VSS level via the current path CP. The voltage level of the complementary local dataline LIOB becomes logic high as the logic high voltage of the complementary bitline BLB transmitted via the column selecting unit 130 becomes equal to the power voltage VA by the operation of the dataline precharging unit 140. The third PMOS transistor 564 in the charge sync unit 560, which is controlled by the logic low local dataline LIO, is turned on, and thus the voltage of the complementary local dataline becomes equal to the logic high power voltage VA via a current path consisting of the first and third PMOS transistors 561 and 564. Accordingly, the charge sync unit 560 detects and amplifies data of the pair of local datalines LIO and LIOB.

In the data sensing unit 570, the same as the data sensing unit 170 shown in FIG. 3, the first, second, and fifth NMOS transistors 171, 172, and 175 are turned on when the dataline sensing enabling signal PLSAE is activated. When the local dataline LIO is amplified to a logic low level and the complementary local dataline LIOB is amplified to a logic high level by the charge sync unit 560, for example, the fourth NMOS transistor 174 of the data sensing unit 570 is turned on, and thus a voltage of the global dataline GIO becomes logic low. The complementary global dataline GIOB maintains the logic high power voltage VA level precharged by a global dataline precharging unit (not shown). Accordingly, the dataline sensing amp 550 detects and amplifies data of the pair of local datalines LIO and LIOB and transmits the amplified data to the pair of global datalines GIO and GIOB.

Figure 6:
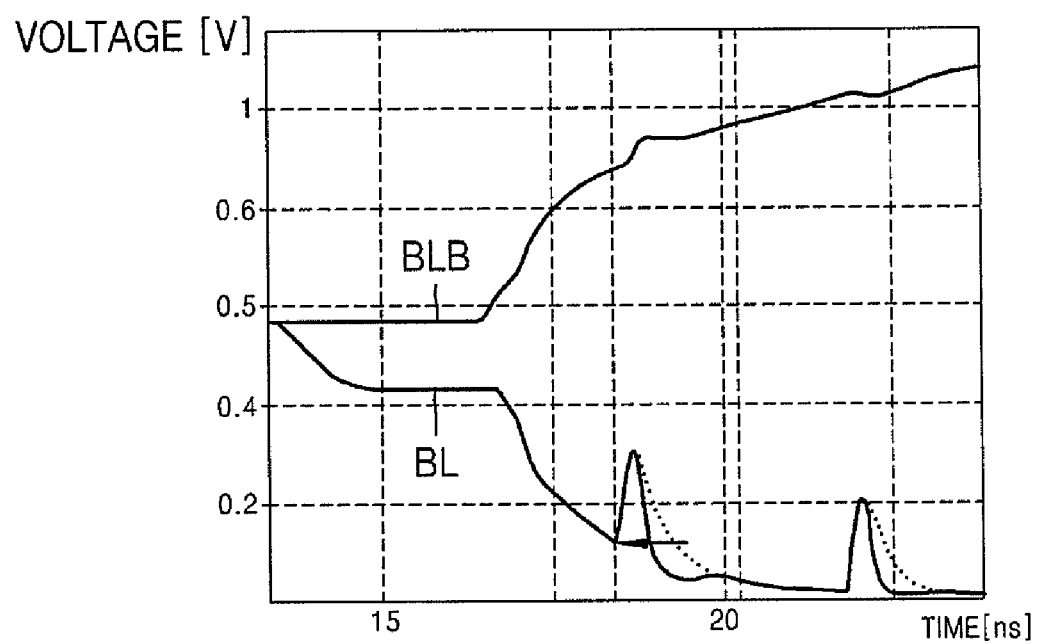
FIGS. 6 and 7 illustrate diagrams showing results of simulated operations of the semiconductor memory device shown in FIG. 3.
Figure 7:
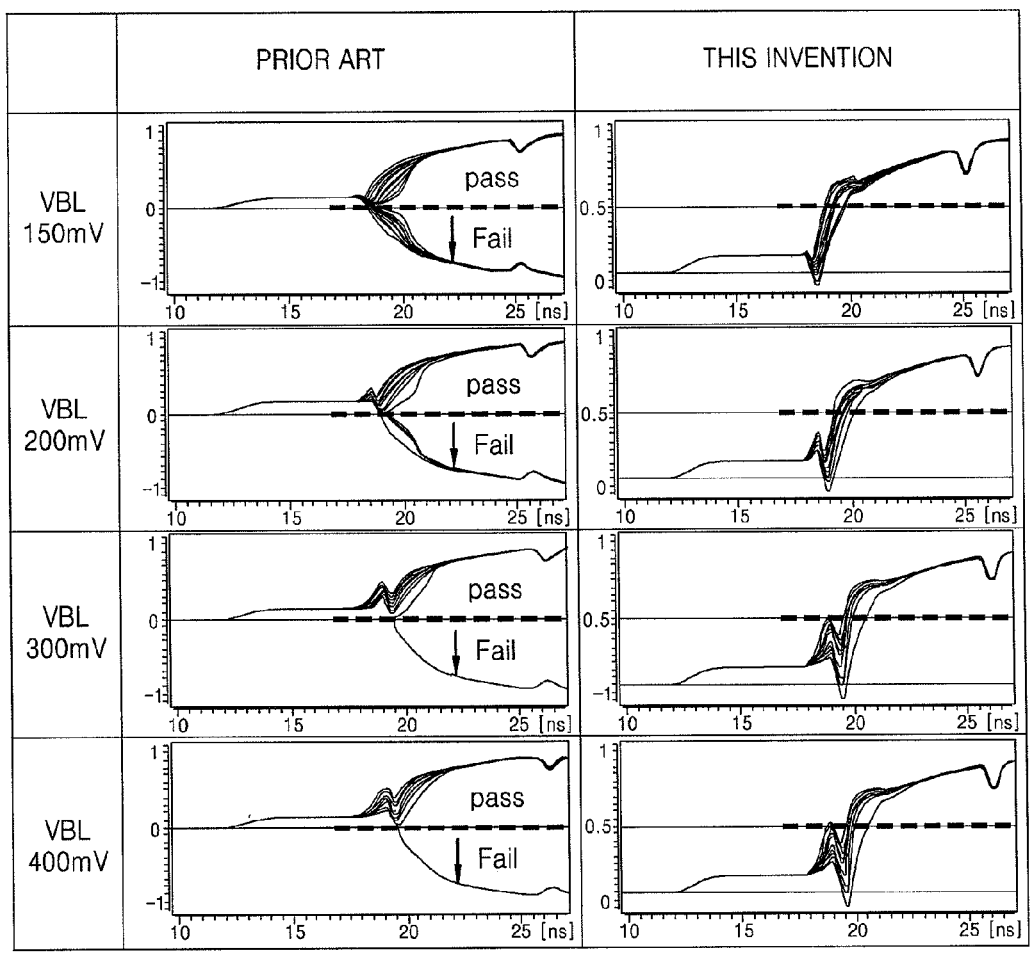

FIGS. 6 and 7 are diagrams showing results of simulated operations of the semiconductor memory device 100 shown in FIG. 3. FIG. 6 is a diagram showing voltage levels of the bitline BL and the complementary bitline BLB that are detected and amplified by the bitline sensing amp 120. FIG. 6 shows that, when the column selecting signal CSL is activated, the voltage level of the bitline BL, which is increased by bitline disturbance due to the local dataline LIO, is reduced due to the operation of the charge sync unit 160 in the dataline sensing amp 150.

FIG. 7 shows results of simulations based on the voltage difference VBL between the bitline BL and the complementary bitline BLB that are detected and amplified. Referring to FIG. 7, in the prior art, when the column selecting signal CSL is activated when the voltage difference VBL between the bitline BL and the complementary bitline BLB is about 450 mV, data of the pair of bitlines BL and BLB are inversed by a bitline disturbance due to the local dataline LIO, and thus a number of defected samples is one. If the tRCD described above in FIG. 2 is set to be short, a number of defective samples increases due to bitline disturbances as the voltage difference VBL between the bitline BL and the complementary bitline BLB is reduced to about 300 mB, 200 mBV, and 150 mV. Without intending to be bound by this theory, FIG. 7 shows that there is no, e.g., substantially no, defective sample with respect to the semiconductor memory device 100 even if the column selecting signal CSL is activated when the voltage differences VBL between the bitline BL and the complementary bitline BLB are about 400 mV, 300 mV, 200 mV, and 150 mV due to the short tRCD. Therefore, it is possible to shorten the tRCD without the occurrence of defects, and thus a semiconductor memory device according to the exemplary embodiments may operate at a high speed.

Figure 8:
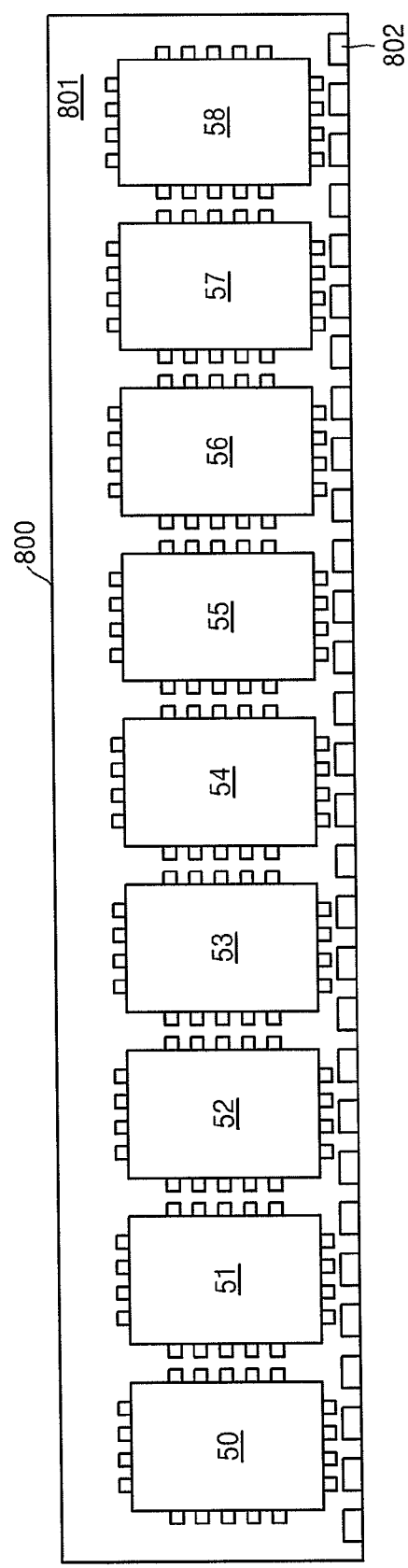
FIG. 8 illustrates a diagram for describing a memory module having memory chips, which include a semiconductor memory device according to an exemplary embodiment.

FIG. 8 is a diagram for describing a memory module 800 having memory chips, which include a semiconductor memory device according to an exemplary embodiment. The memory module 800 of FIG. 8 includes memory chips 50 through 58, which include the semiconductor devices 100 and 500 shown in FIG. 3 or FIG. 5. The memory module 800 is a single in line memory module (SIMM), in which nine memory chips 50 through 58 are arranged on a surface of a printed circuit board (PCB) 801. Numbers of such memory chips in a SIMM may vary from 3 to 9 in most cases. The PCB 801 includes an edge connector 802, so that the PCB 801 may be inserted to a memory socket on the motherboard of a computer. Although not shown, a wiring pattern is formed on the PCB 801, so that terminals or leads constituting the edge connector 802 are connected to the memory chips 50 through 58.

Figure 9:
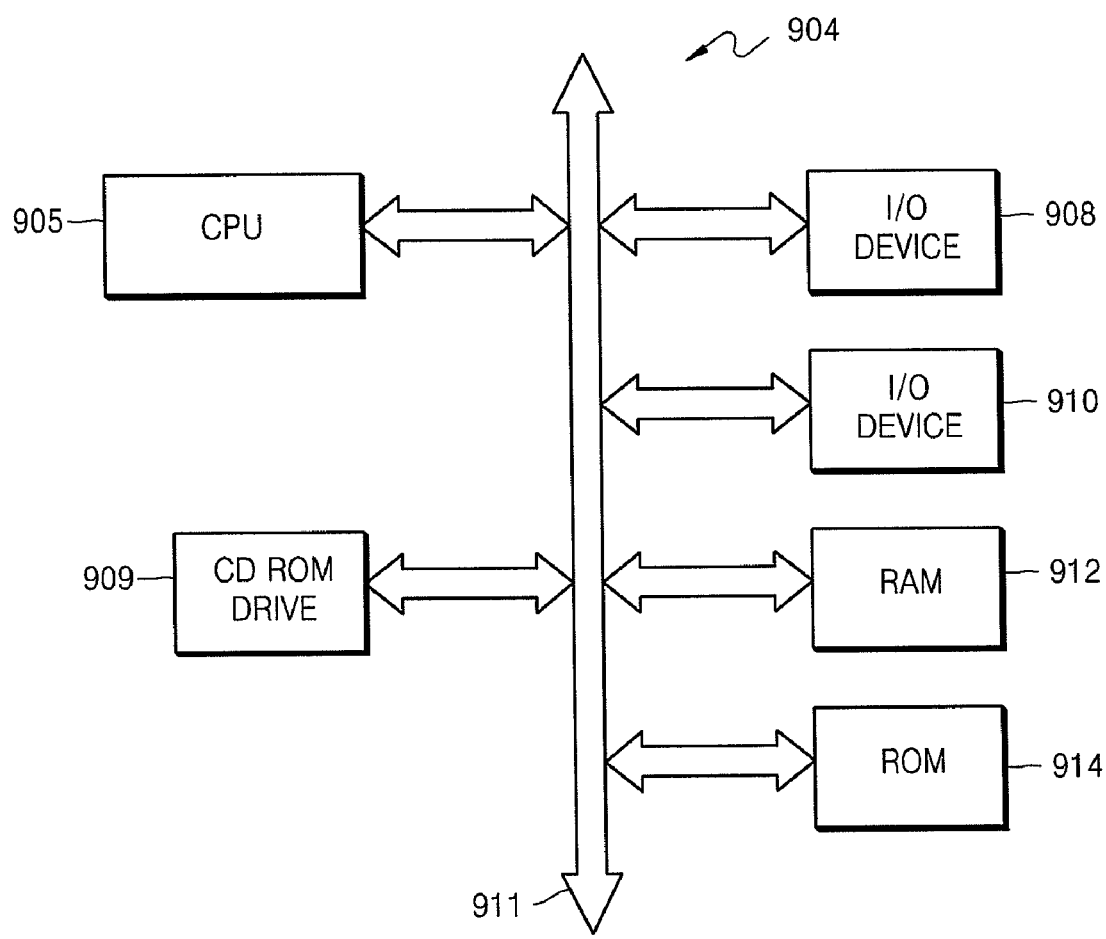
FIG. 9 illustrates a block diagram of a system based on a processor employing a random access memory (RAM), which is embodied by using a semiconductor memory device according to an exemplary embodiment.

FIG. 9 is a block diagram of a system 904 based on a processor employing a random access memory (RAM) 912, which is embodied by using a semiconductor memory device according to an exemplary embodiment. In other words, the RAM 912 employs a dataline sensing amp as described with reference to FIG. 3 or FIG. 5. The processor-based system 904 may be a computer system, a processor control system, or another system employing a memory based processor. The system 904 includes a CPU 905, such as a microprocessor, wherein the CPU 905 communicates with the RAM 912 and input/output devices 908 and 910 via a bus 911. The system 904 includes a read-only memory (ROM) 914 and peripheral devices, such as a CD-ROM drive 909 that communicates with the CPU 905 via the bus 911.

While the inventive concept has been particularly shown and described with reference to exemplary embodiments thereof, it will be understood that various changes in form and details may be made therein without departing from the spirit and scope of the following claims.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. A semiconductor memory device comprising:
a bitline sensing amp configured to detect and amplify data of a pair of bitlines, the data of the pair of bitlines being memory cell data transmitted to the pair of bitlines;
a column selecting unit configured to transmit the data of the pair of bitlines to a pair of local datalines in response to a column selecting signal;
a dataline precharging unit configured to precharge the pair of local datalines to a precharging voltage level in response to a precharging signal; and
a dataline sensing amp configured to detect and amplify data of the pair of local datalines,
wherein the dataline sensing amp includes:
a charge sync unit configured to discharge charges of the pair of local datalines at the precharging voltage level in response to a first dataline sensing enabling signal and the data of the pair of local datalines; and
a data sensing unit configured to transmit data of the pair of local datalines to a pair of global datalines in response to a second dataline sensing enabling signal.

2. The semiconductor memory device as claimed in claim 1, wherein the charge sync unit detects and amplifies the data of the pair of local datalines.

3. The semiconductor memory device as claimed in claim 1, wherein the first dataline sensing enabling signal is simultaneously activated with the column selecting signal.

4. The semiconductor memory device as claimed in claim 1, wherein the first dataline sensing enabling signal is activated before the second dataline sensing enabling signal is activated.

5. The semiconductor memory device as claimed in claim 1, wherein the first dataline sensing enabling signal is simultaneously activated with the second dataline sensing enabling signal.

6. The semiconductor memory device as claimed in claim 1, wherein the first dataline sensing enabling signal is activated after the second dataline sensing enabling signal is activated.

7. The semiconductor memory device as claimed in claim 1, wherein the charge sync unit includes:
a first NMOS transistor, a gate of the first NMOS transistor being connected to a local dataline and a drain of the first NMOS transistor being connected to a complementary local dataline;
a second NMOS transistor, a gate of the second NMOS transistor being connected to the complementary local dataline and a drain of the second NMOS transistor being connected to the local dataline; and
a third NMOS transistor, a drain of the third NMOS transistor being connected to sources of the first and second NMOS transistors, the first dataline sensing enabling signal being input to a gate of the third NMOS transistor, and a source of the third NMOS transistor being grounded.

8. The semiconductor memory device as claimed in claim 1, wherein the data sensing unit includes:
a first NMOS transistor, the second dataline sensing enabling signal being input to a gate of the first NMOS transistor, and the complementary global dataline being connected to a drain of the first NMOS transistor;
a second NMOS transistor, the second dataline sensing enabling signal being input to a gate of the second NMOS transistor, and the global dataline being connected to a drain of the second NMOS transistor;
a third NMOS transistor, the local dataline being connected to a gate of the third NMOS transistor, and a source of the first NMOS transistor being connected to a drain of the third NMOS transistor;
a fourth NMOS transistor, the complementary local dataline being connected to a gate of the fourth NMOS transistor, and a source of the second NMOS transistor being connected to a drain of the fourth NMOS transistor; and
a fifth NMOS transistor, the sources of the third and fourth NMOS transistors being connected to a drain of the fifth NMOS transistor, the second dataline enabling sensing enabling signal being input to a gate of the fifth NMOS transistor, and a ground voltage VSS being input to a source of the fifth NMOS transistor.

9. A semiconductor memory device comprising:
a bitline sensing amp configured to detect and amplify data of a pair of bitlines, the data of the pair of bitlines being memory cell data transmitted to the pair of bitlines;
a column selecting unit configured to transmit the data of the pair of bitlines to a pair of local datalines in response to a column selecting signal;
a dataline precharging unit configured to precharge the pair of local datalines to a precharging voltage level in response to a precharging signal; and
a dataline sensing amp configured to detect and amplify data of the pair of local datalines,
wherein the dataline sensing amp comprises:

a sensing control unit configured to generate an inversed dataline sensing enabling signal in response to a first dataline sensing enabling signal;

a charge sync unit configured to discharge charges of the pair of local datalines at the precharging voltage level in response to the first dataline sensing enabling signal, the inversed dataline sensing enabling signal, and the data of the pair of local datalines; and a data sensing unit configured to transmit the data of the pair of local datalines to a pair of global datalines in response to a second dataline sensing enabling signal.

10. The semiconductor memory device as claimed in claim 9, wherein the charge sync unit detects and amplifies the data of the pair of local datalines.

11. The semiconductor memory device as claimed in claim 9, wherein the first dataline sensing enabling signal is simultaneously activated with the column selecting signal.

12. The semiconductor memory device as claimed in claim 9, wherein the charge sync unit includes:

a first PMOS transistor, the inversed dataline sensing enabling signal being input to a gate of the first PMOS transistor, and a power voltage being input to a source of the first PMOS transistor;

a first NMOS transistor, the dataline sensing enabling signal being input to a gate of the second NMOS transistor, and a ground voltage being input to a source of the second NMOS transistor;

a second PMOS transistor interconnected between a drain of the first PMOS transistor and a local dataline, and a complementary local dataline is connected to a gate of the second PMOS transistor;

a third PMOS transistor interconnected between a drain of the first PMOS transistor and the complementary local dataline, the local dataline being connected to a source of the third PMOS transistor;

a second NMOS transistor interconnected between a drain of the first NMOS transistor and the local dataline, the complementary local dataline being connected to a gate of the second NMOS transistor; and a third NMOS transistor interconnected between the drain of the first NMOS transistor and the complementary local dataline, the local dataline being connected to a gate of the third NMOS transistor.

13. The semiconductor memory device as claimed in claim 9, wherein the data sensing unit includes:

a first NMOS transistor, the dataline sensing enabling signal being input to a gate of the first NMOS transistor, and a complementary global dataline being connected to a drain of the first NMOS transistor;

a second NMOS transistor, the dataline sensing enabling signal being input to a gate of the second NMOS transistor, and the global dataline being connected to a drain of the second NMOS transistor;

a third NMOS transistor, a local dataline being connected to a gate of the third NMOS transistor, and a source of the first NMOS transistor being connected to a drain of the third NMOS transistor;

a fourth NMOS transistor, the complementary local dataline being connected to a gate of the fourth NMOS transistor, and a source of the second NMOS transistor being connected to a drain of the fourth NMOS transistor; and a fifth NMOS transistor, the sources of the third and fourth NMOS transistors being connected to a drain of the fifth NMOS transistor, the dataline enabling sensing enabling signal being input to a gate of the fifth NMOS transistor, and the ground voltage VSS being input to a source of the fifth NMOS transistor.

14. A method of operating a semiconductor memory device, the method comprising:

precharging a pair of local datalines to a precharging voltage level in response to a precharging signal;

detecting and amplifying memory cell data transmitted to a pair of bitlines;

transmitting data of the pair of bitlines to the pair of local datalines in response to a column selecting signal;

detecting and amplifying data of the pair of local datalines;

discharging charges of the pair of local datalines at a precharging voltage level in response to a first dataline sensing enabling signal and the data of the pair of local datalines; and transmitting the data of the pair of local datalines to a pair of global datalines in response to a second dataline sensing enabling signal.

15. The method as claimed in claim 14, wherein the first dataline sensing enabling signal is simultaneously activated with the column selecting signal.

16. The method as claimed in claim 14, wherein the first dataline sensing enabling signal is activated before the second dataline sensing enabling signal is activated.

17. The method as claimed in claim 14, wherein the first dataline sensing enabling signal is simultaneously activated with the second dataline sensing enabling signal.

18. The method as claimed in claim 14, wherein the first dataline sensing enabling signal is activated after the second dataline sensing enabling signal is activated.

19. A method of operating a semiconductor memory device, the method comprising:

precharging a pair of local datalines to a precharging voltage level in response to a precharging signal;

detecting and amplifying memory cell data transmitted to a pair of bitlines;

transmitting data of the pair of bitlines to the pair of local datalines in response to a column selecting signal;

detecting and amplifying data of the pair of local datalines;

discharging charges of the pair of local datalines at a precharging voltage level in response to a first dataline sensing enabling signal and an inversed dataline sensing enabling signal; and transmitting the data of the pair of local datalines to a pair of global datalines in response to a second dataline sensing enabling signal.

20. The method as claimed in claim 19, wherein the first dataline sensing enabling signal is simultaneously activated with the column selecting signal.

* * * * *